US011270919B2

(12) United States Patent
Arvelo et al.

(10) Patent No.: US 11,270,919 B2
(45) Date of Patent: Mar. 8, 2022

(54) CUSTOMIZED MODULE LID

(71) Applicant: International Business Machines Corporation, Armonk, NY (US)

(72) Inventors: Amilcar R. Arvelo, Poughkeepsie, NY (US); Michael J. Ellsworth, Lagrangeville, NY (US); Eric J. McKeever, Poughkeepsie, NY (US); Thong N. Nguyen, Poughkeepsie, NY (US); Edward J. Seminaro, Milton, NY (US)

(73) Assignee: International Business Machines Corporation, Armonk, NY (US)

( * ) Notice: Subject to any disclaimer, the term of this patent is extended or adjusted under 35 U.S.C. 154(b) by 551 days.

(21) Appl. No.: 16/205,315

(22) Filed: Nov. 30, 2018

(65) Prior Publication Data

US 2019/0109058 A1 Apr. 11, 2019

Related U.S. Application Data

(60) Division of application No. 14/834,478, filed on Aug. 25, 2015, now Pat. No. 10,163,742, which is a (Continued)

(51) Int. Cl.
| | |
|---|---|
| *H01L 23/043* | (2006.01) |
| *H05K 3/30* | (2006.01) |
| *H01L 23/04* | (2006.01) |
| *H01L 21/48* | (2006.01) |
| *H01L 23/06* | (2006.01) |
| *H01L 23/367* | (2006.01) |
| *H01L 23/42* | (2006.01) |

(52) U.S. Cl.
CPC ........ *H01L 23/043* (2013.01); *H01L 21/4817* (2013.01); *H01L 23/04* (2013.01); *H01L 23/06* (2013.01); *H01L 23/3675* (2013.01); *H05K 3/30* (2013.01); *H01L 23/42* (2013.01); *H01L 2924/0002* (2013.01)

(58) Field of Classification Search
CPC ....... H01L 23/043; H01L 23/04; H01L 23/06; H01L 23/42; H01L 23/3675; H01L 21/4817; H01L 2924/0002; H01L 27/3246; H01L 27/3248; H01L 27/3258; H01L 2924/00; H01L 51/5203; H01L 51/56; H05K 3/30
USPC ................................. 29/841, 832, 833–840
See application file for complete search history.

(56) References Cited

U.S. PATENT DOCUMENTS

| | | |
|---|---|---|
| 4,378,139 A | 3/1983 | Griffin et al. |
| 4,402,185 A | 9/1983 | Perchak |

(Continued)

OTHER PUBLICATIONS

IBM: List of IBM Patents or Patent Applications Treated as Related (Appendix P), Dec. 10, 2018, 2 pages.

*Primary Examiner* — Minh N Trinh
(74) *Attorney, Agent, or Firm* — L. Jeffrey Kelly

(57) ABSTRACT

A method of forming a custom module lid. The method may include placing a multichip module (MCM) between a module base and a temporary lid, target components are exposed through viewing windows in the temporary lid, a top surface of the target components is measured and mapped to create a target profile, the target profile is used to form custom pockets in a custom lid, and the custom pockets correspond to the target components.

20 Claims, 15 Drawing Sheets

Related U.S. Application Data continuation of application No. 14/535,391, filed on Nov. 7, 2014, now Pat. No. 9,496,194.

(56) References Cited

U.S. PATENT DOCUMENTS

| | | |
|---|---|---|
| 4,551,747 A | 11/1985 | Gilbert et al. |
| 4,699,593 A | 10/1987 | Grabbe et al. |
| 5,027,191 A | 6/1991 | Bourdelaise et al. |
| 5,052,481 A | 10/1991 | Horvath et al. |
| 5,172,755 A | 12/1992 | Samarov |
| 5,387,120 A | 2/1995 | Marks et al. |
| 5,602,719 A | 2/1997 | Kinion |
| 5,646,828 A | 7/1997 | Degani et al. |
| 5,650,593 A | 7/1997 | McMillan et al. |
| 5,761,039 A | 6/1998 | Bruees et al. |
| 5,785,535 A | 7/1998 | Brodsky et al. |
| 5,828,127 A | 10/1998 | Yamagata et al. |
| 6,015,301 A | 1/2000 | Brodsky et al. |
| 7,269,015 B2 | 9/2007 | Hornung et al. |
| 7,724,527 B2 | 5/2010 | Coico et al. |
| 8,235,593 B2 | 8/2012 | Sri-Jayantha et al. |
| 8,251,714 B2 | 8/2012 | Yeh |
| 8,564,955 B2 | 10/2013 | Schmidt et al. |
| 9,490,188 B2 | 11/2016 | Arvelo et al. |
| 9,496,194 B2 | 11/2016 | Arvelo et al. |
| 9,818,667 B2 | 11/2017 | Arvelo et al. |
| 2003/0214800 A1 | 11/2003 | Dibene, II et al. |
| 2004/0036154 A1 | 2/2004 | Ho et al. |
| 2004/0100778 A1 | 5/2004 | Vinciarelli et al. |
| 2005/0127500 A1 | 6/2005 | Colgan et al. |
| 2006/0067054 A1 | 3/2006 | Wang et al. |
| 2006/0120058 A1 | 6/2006 | Fairchild et al. |
| 2007/0029811 A1 | 2/2007 | Kostuchowski et al. |
| 2009/0001553 A1* | 1/2009 | Pahl ............... B81B 7/0064 257/704 |
| 2009/0283902 A1 | 11/2009 | Bezama et al. |
| 2009/0314522 A1 | 12/2009 | Janesch et al. |
| 2010/0071950 A1* | 3/2010 | Ohsumi ......... H01L 23/49838 174/261 |
| 2010/0129959 A1 | 5/2010 | Lim et al. |
| 2012/0256653 A1 | 10/2012 | Cordero et al. |
| 2013/0147028 A1 | 6/2013 | Su et al. |
| 2014/0002979 A1 | 1/2014 | Leigh et al. |
| 2014/0254098 A1 | 9/2014 | Arvelo et al. |
| 2016/0157359 A1 | 6/2016 | Arvelo et al. |
| 2019/0109058 A1* | 4/2019 | Arvelo ............ H01L 23/043 |

* cited by examiner

CUSTOMIZED MODULE LID

STATEMENT REGARDING FEDERALLY SPONSORED RESEARCH OR DEVELOPMENT

This invention was made with United States Government support under DARPA Agreement No. H98230-13-D-0122. THE GOVERNMENT HAS CERTAIN RIGHTS IN THIS INVENTION.

BACKGROUND

The present invention generally relates to packaging of computer chip modules, and more particularly to a custom module lid.

As microelectronics technology progresses, computer chip power density is increasing. Devices that use computer chips are, in turn, becoming more fully integrated and packaged closer together. Today small gap technology (SGT) and very thin thermal interface materials (TIM) are used to fill the gap between chips and module lids.

The SGT process works by placing shims on the chips and soldering copper pucks, centered over each chip, to the module lid. Once the pucks are soldered in place the module lid top surface is machined flat so a second thermal interface material can be added to the top surface and then a heat sink or cold plate is installed.

SUMMARY

According to one embodiment of the present invention, a method is provided. The method may include providing a module base, wherein the module base includes a base pocket, the base pocket is an opening in the module base on a top surface of the module base, and the base pocket has a depth extending into the module base that is less than a thickness of the module base; placing a first thermal interface material (TIM) in the base pocket, wherein the first TIM is on a bottom surface of the base pocket; placing a multi-chip module (MCM) on the module base, wherein the MCM includes a substrate, a first component, a second component and a target component, the first component is a component on a bottom surface of the substrate, the second component and target component are components on a top surface of the substrate, the first component has a corresponding base pocket and fits inside of the corresponding base pocket, the first TIM is between the bottom surface of the base pocket and a bottom surface of the first component, and the bottom surface of the substrate directly contacts a top surface of the module base; providing a temporary lid, wherein the temporary lid includes, a viewing window, a datum window and a temporary pocket, the viewing window and the datum window are openings extending from a top surface of the temporary lid to a bottom surface of the temporary lid, the temporary pocket is an opening in the temporary lid on the bottom surface of the temporary lid, and the temporary pocket has a depth extending into the temporary lid that is less than a thickness of the temporary lid; placing the temporary lid on the MCM, wherein the second component has a corresponding temporary pocket and fits inside of the corresponding temporary pocket, the target component has a corresponding viewing window and fits inside of the corresponding viewing window, a portion of the substrate corresponds to the datum window, and the bottom surface of the temporary lid directly contacts the top surface of the substrate; measuring a surface profile of the target component through the viewing window and a surface profile of the substrate through the datum window; providing a custom lid, wherein the custom lid has a custom pocket and a standard pocket, the custom pocket and the standard pocket are openings in the custom lid on a bottom surface of the custom lid, the custom pocket and the standard pocket each have a depth extending into the custom lid that are less than a thickness of the custom lid, the custom pocket has an inside surface with a same profile as the target component surface profile, and the standard pocket has an inside surface with a flat profile; placing a second TIM in the custom pocket and in the standard pocket, wherein a portion of the second TIM is on a top surface of the custom pocket and a portion of the second TIM is on a top surface of the standard pocket; and placing the custom lid on the MCM, wherein the second component has a corresponding standard pocket and fits inside of the corresponding standard pocket, the target component has a corresponding custom pocket and fits inside of the corresponding custom pocket, the second TIM is between the top surface of the custom pocket and the top surface of the target component, the second TIM is between the top surface of the standard pocket and a top surface of the second component, and the bottom surface of the custom lid directly contacts the top surface of the substrate.

According to another embodiment of the present invention, a method is provided. The method may include placing a multichip module (MCM) on a module base, wherein the MCM includes a substrate and a target component, the target component is on a top surface of the substrate, and a bottom surface of the substrate is in direct contact with a top surface of the module base; providing a temporary lid including a viewing window, wherein the viewing window is an opening extending from a top surface of the temporary lid to a bottom surface of the temporary lid; placing the temporary lid on the MCM, wherein the target component fits inside of the viewing window, and the bottom surface of the temporary lid is on the top surface of the substrate; mapping a surface profile of the target component through the viewing window; and providing a custom lid having a custom pocket, wherein the custom pocket is an opening in the custom lid on a bottom surface of the custom lid, the custom pocket has a depth extending into the custom lid that is less than a thickness of the custom lid, and the custom pocket has an inside surface with a same profile as the target component surface profile.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
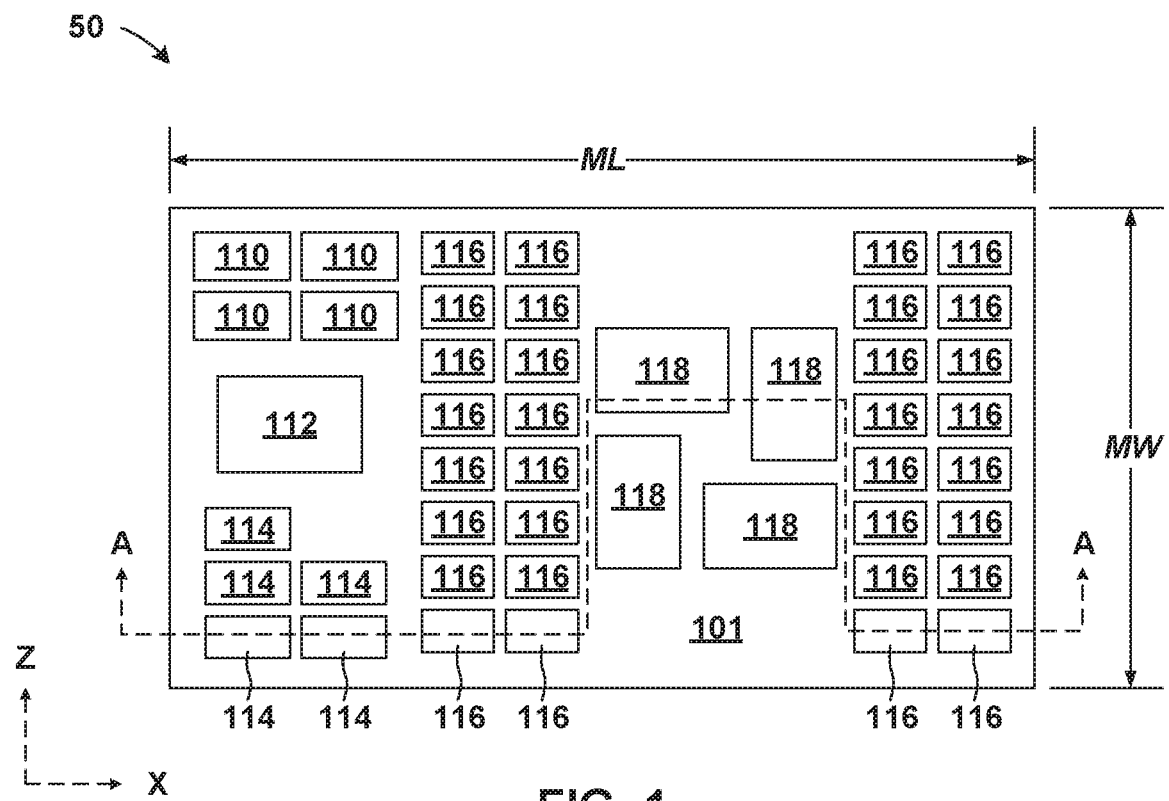
FIG. 1 is a top view of a multichip module, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. It should be noted, the term "correspond" or "corresponding" may be a reference to a similar location and similar dimensions.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to packaging of computer chip modules, and more particularly to a custom module lid. Ideally, it may be desirable to form a module lid having customized pockets for components with varying surface topography. One purpose of forming a custom module lid is to prevent undesirable or unavoidable gaps between a chip component and a module lid.

One way to form a custom module lid is to set a multichip module on a prefabricated module base, then attaching a temporary lid to the module base leaving a top surface of a target component exposed through a viewing window, an optical or mechanical measurement technique may be used to measure and map the top surface of the target component, and forming a custom lid having a custom pocket with a same surface profile as the top surface of the target component. One embodiment by which to form a custom module lid is described in detail below with reference to the accompanying drawings FIGS. 1-16.

Figure 2:
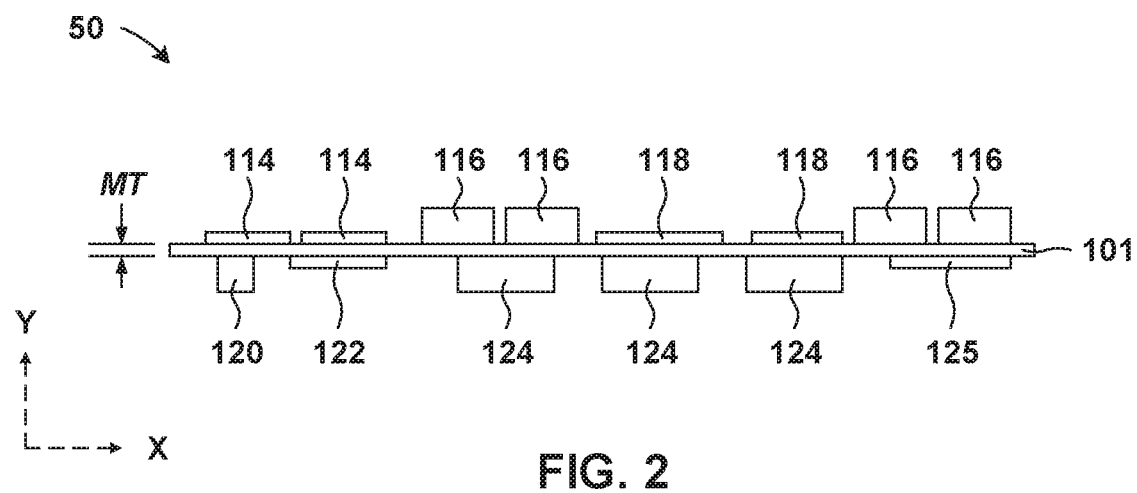
FIG. 2 is a cross section view of the multichip module, according to an exemplary embodiment.
Figure 3:
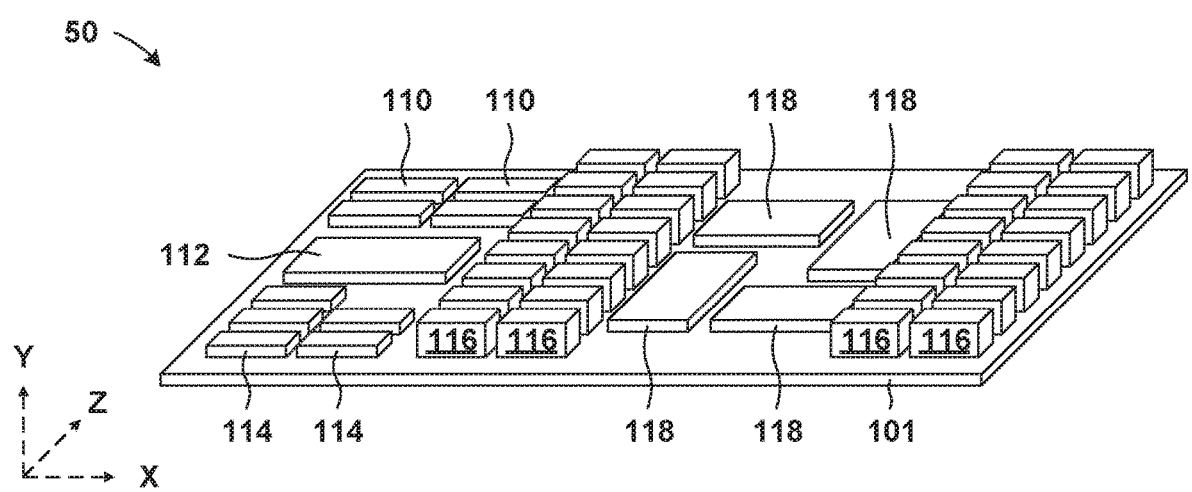
FIG. 3 is a top isometric view of the multichip module, according to an exemplary embodiment.
Figure 4:
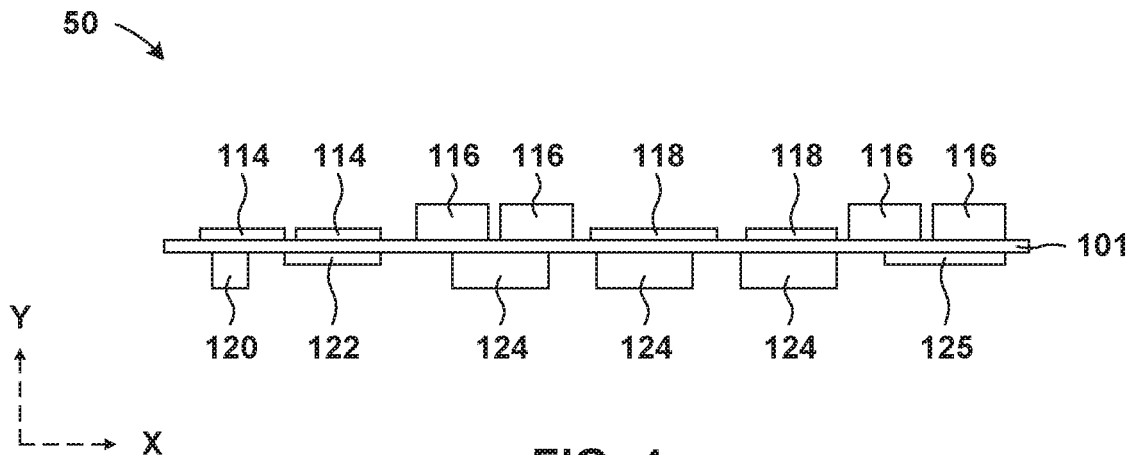
FIG. 4 is a cross section view of the multichip module, according to an exemplary embodiment.
Figure 5:
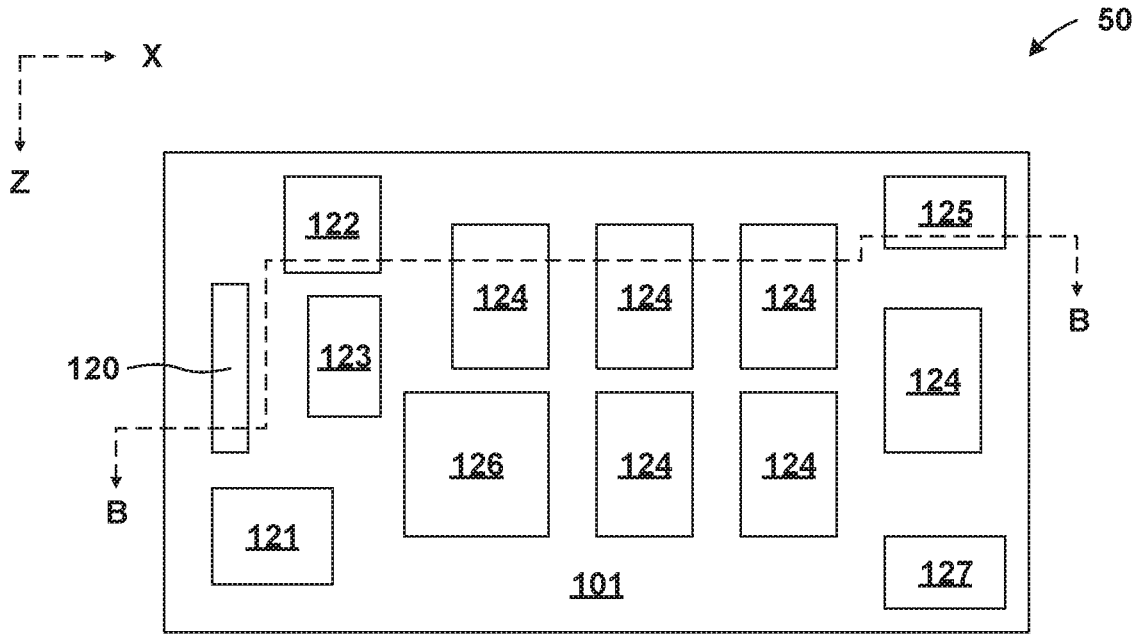
FIG. 5 is a bottom view of the multichip module, according to an exemplary embodiment.
Figure 6:
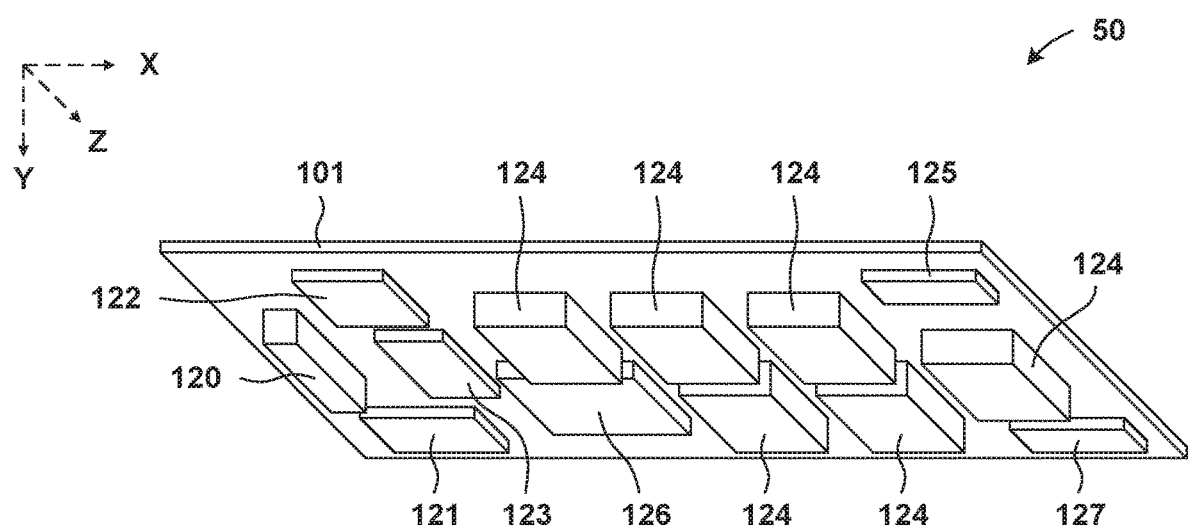
FIG. 6 is a bottom isometric view of the multichip module, according to an exemplary embodiment.

Now referring to FIGS. 1-6, a multichip module (MCM) 50 during an intermediate step of a method of fabricating a custom module lid is illustrated, according to an embodiment. More specifically, the MCM 50 may include multiple components (e.g., integrated circuit chips or "chips") on a top and on a bottom of the MCM 50. FIG. 1 illustrates a top view of the MCM 50 along an x-z plane, FIG. 2 illustrates a cross section view of the MCM 50 taken along section line A, FIG. 3 illustrates an isometric view of the MCM 50, FIG. 4 illustrates the cross section view of the MCM 50 taken along section line B, FIG. 5 illustrates a bottom view of the MCM 50 along an x-z plane, and FIG. 6 illustrates an isometric view of the MCM 50. It should be noted, for illustrative purposes, the cross section views of the MCM 50 may illustrate a top surface of the integrated circuit chips along section line A and a bottom surface of the integrated circuit chips along section line B, for illustrative purposes. Also, the integrated circuit chips may be referred to as chips or components.

The MCM 50 may include multiple components on a substrate 101. The substrate 101 may be an organic or inorganic substrate. In an embodiment, the substrate 101 may be an organic laminate or ceramic. The substrate 101 may have a module thickness (MT) of about 0.7 mm, a module width (MW) of about 90 mm, and a module length (ML) of about 170 mm, but other dimensions may be used. The substrate 101 may have connection features formed thereon (not illustrated), which may be operatively interconnected with connection points of the components (e.g., signal traces or tracks formed on the top and/or bottom surfaces using a conductive material such as copper, with contact pins, tines, sockets, pads or strips at terminal ends of the traces).

The components may be adhesively bonded or mechanically fastened to the substrate 101, and electrical connections may be completed using various technologies, such as, for example, solder balls (e.g., controlled collapse chip connection, or "C4") or surface mount technology. Alternatively, the components can be deposited on the substrate 101 using thin film technology.

The components may include, for example, a hybrid memory cube (HMC) 116, an application-specific integrated circuit (ASIC) 118, a dynamic random-access memory (DRAM) 110, a trusted platform module (TPM) 114, a connector 120, a soft switch 121, a baseboard management controller (BMC) 122, a switch 126, a voltage transformation module (VTM) 124, a 3.3V buck regulator 125, a 1.5V buck regulator 127, a region 112, a region 123, and/or other module components. A region 112 may include, for example, an ARM processor, a crystal 24 MHz, an LDO, and flash memory. A region 123 may include, for example, a BMC oscillator, a BMC uReset, an RS485, a fan-out buffer, a crystal 25 MHz, and a serial electrically-erasable programmable read-only memory (SEEPROM). The ASIC(s) 118 (which may act as processors) and the HMC(s) 116 may have the highest power dissipation densities among all of the chips on the MCM 50, so they may be placed on the top surface of the substrate 101 for subsequent measurements.

In an embodiment, a first component may be on a bottom surface of the substrate 101, a second component and a target component may be on a top surface of the substrate 101. The target component may include a component having higher surface peak fluctuations (e.g., components that may pose a problem if packaged in a pocket having a flat inside pocket surface). The first component may include the connector 120, the soft switch 121, the BMC 122, the switch 126, the VTM 124, the 3.3V buck regulator 125, the 1.5V buck regulator 127, and/or the region 123. The second component may include the HMC 116, the DRAM 110, the TPM 114, and the region 112. The target component may be the ASIC 118. It should be noted, any number of chips may be located on the top surface and/or the bottom surface of the MCM 50.

Figure 7:
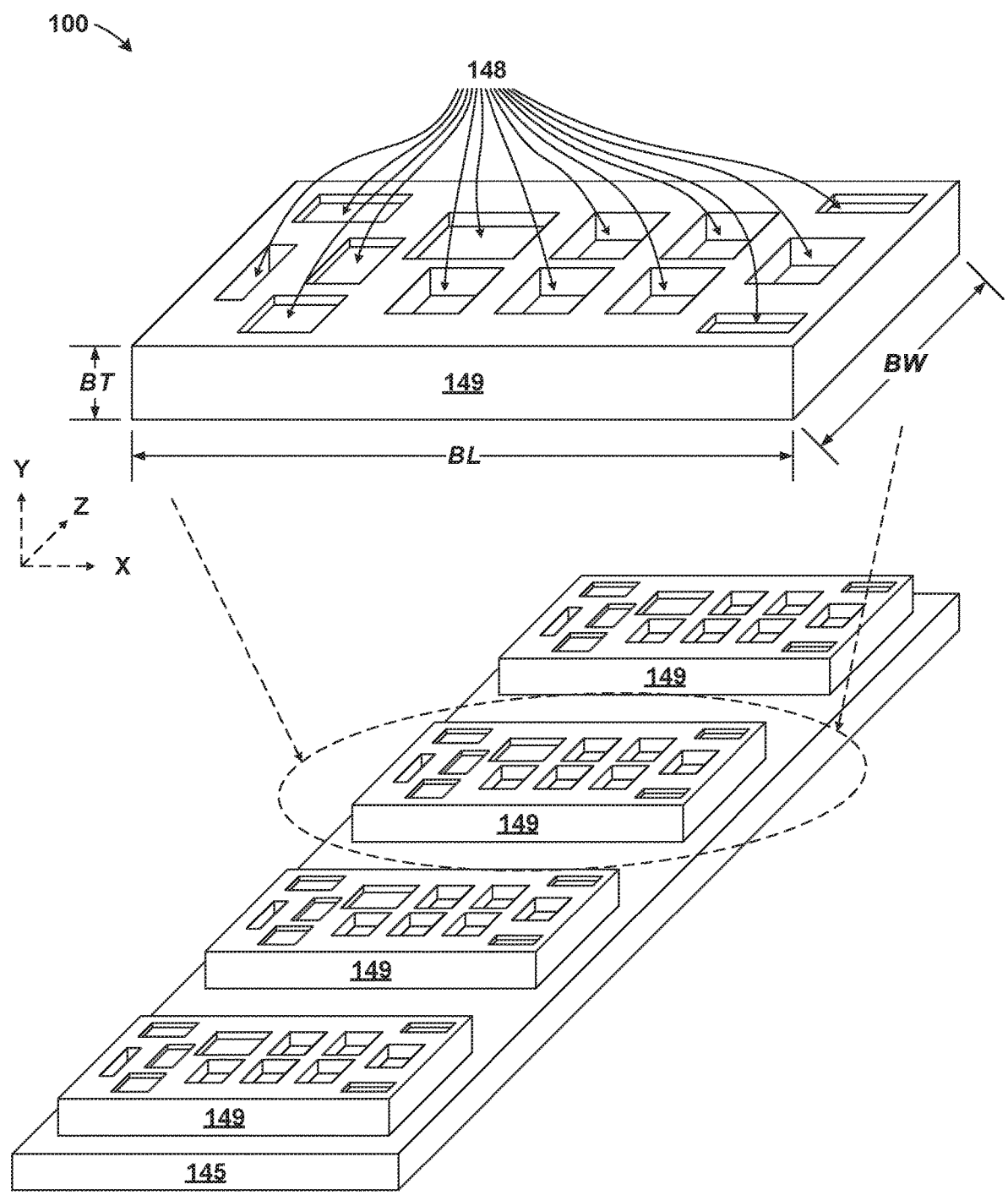
FIG. 7 is an illustration of a module base, according to an exemplary embodiment.

Now referring to FIG. 7, an apparatus 100 during an intermediate step of a method of fabricating a custom module lid is illustrated, according to an embodiment. More specifically, the method may include fabricating a module base 149.

The module base 149 may be formed using any known formation techniques known in the art, such as, for example, a machine processing technique. The module base 149 may include any durable material having a high thermal conductivity, such as, for example, a metal or metallic alloy including aluminum. The module base 149 may have a base thickness (BT) of about 14.5 mm, a base width (BW) of about 102 mm, and a base length (BL) of about 182 mm, but other dimensions may be used. The dimensions of the module base 149 may vary depending on MCM 50. In an embodiment, the base width (BW) is larger than the module width (MW) and the base length (BL) is larger than the module length (ML).

The module base 149 may include a base pocket 148. The base pocket 148 may be formed in the module base 149 using any method known in the art, such as, for example, a machine processing technique. The module base 149 may be an opening in the module base 149 extending from the top surface of the module base 149. The base pocket 148 may have a depth being less than the base thickness (BT). A top surface of the module base 149 may be machined to form a flat surface, preferably within ±0.0005 in.

In an embodiment, there are multiple base pockets 148, where each base pocket 148 has corresponding dimensions and x-z plane location as a corresponding first component (e.g., components on a bottom surface of the substrate 101, described above), such that the first component may fit inside of the corresponding base pocket 148. In the embodiment, four module bases 149 are illustrated and each module base 149 is fastened to a jig plate 145. It should be noted, the term "correspond" or "corresponding" may be a reference to similar locations and/or similar dimensions.

In an alternative embodiment (not illustrated), the module base may have a slot extending around a perimeter of the module base 149. The slot may provide a connection for subsequent module lid attachment. The top surface of the module base 149 may be recessed below the slot or a sidewall, such that a portion of, or an entirety of, the MCM 50 may fit within the recess.

Figure 8:
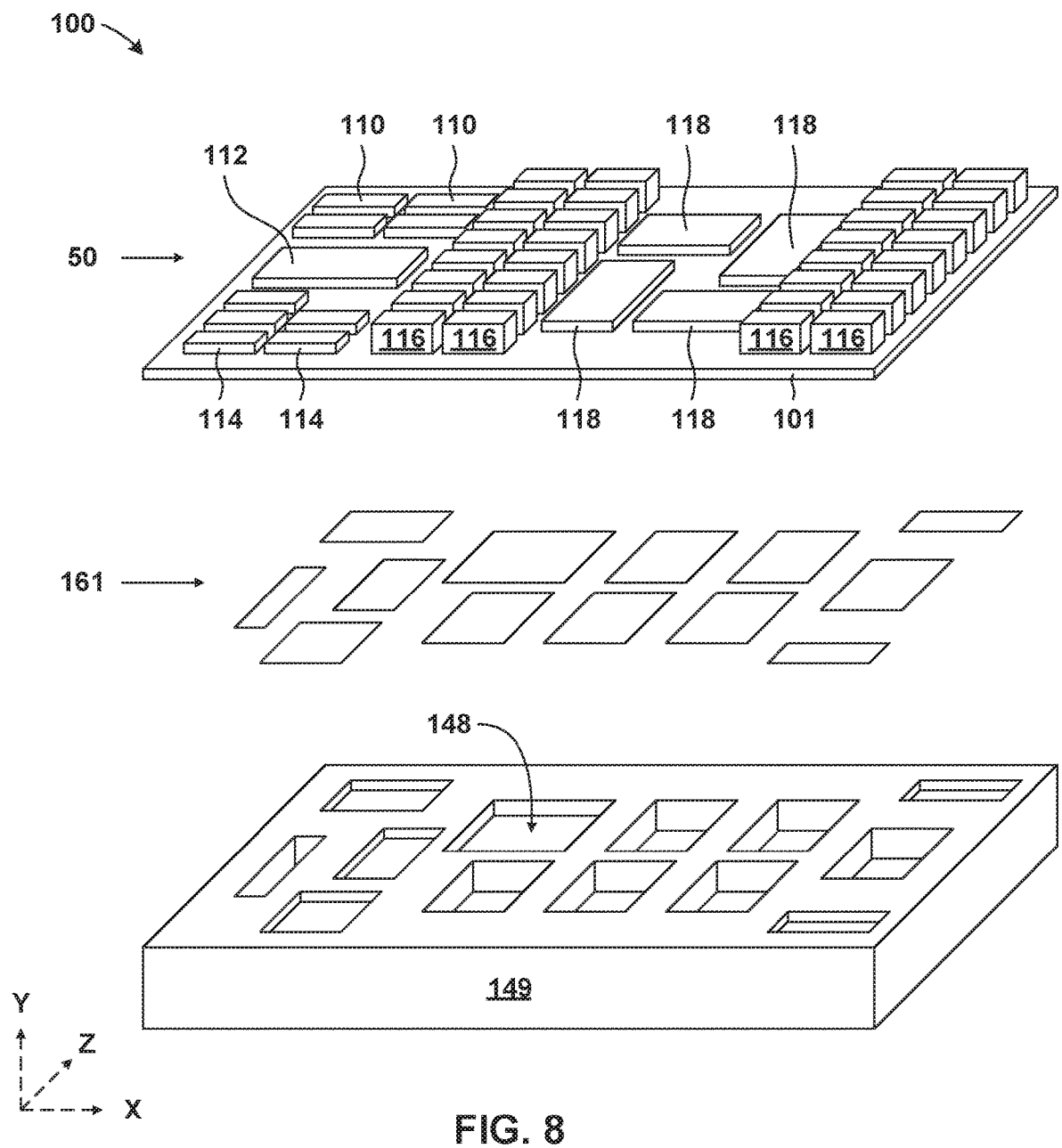
FIG. 8 is an exploded view of a first thermal interface material set between the multichip module and the module base, according to an exemplary embodiment.
Figure 9:
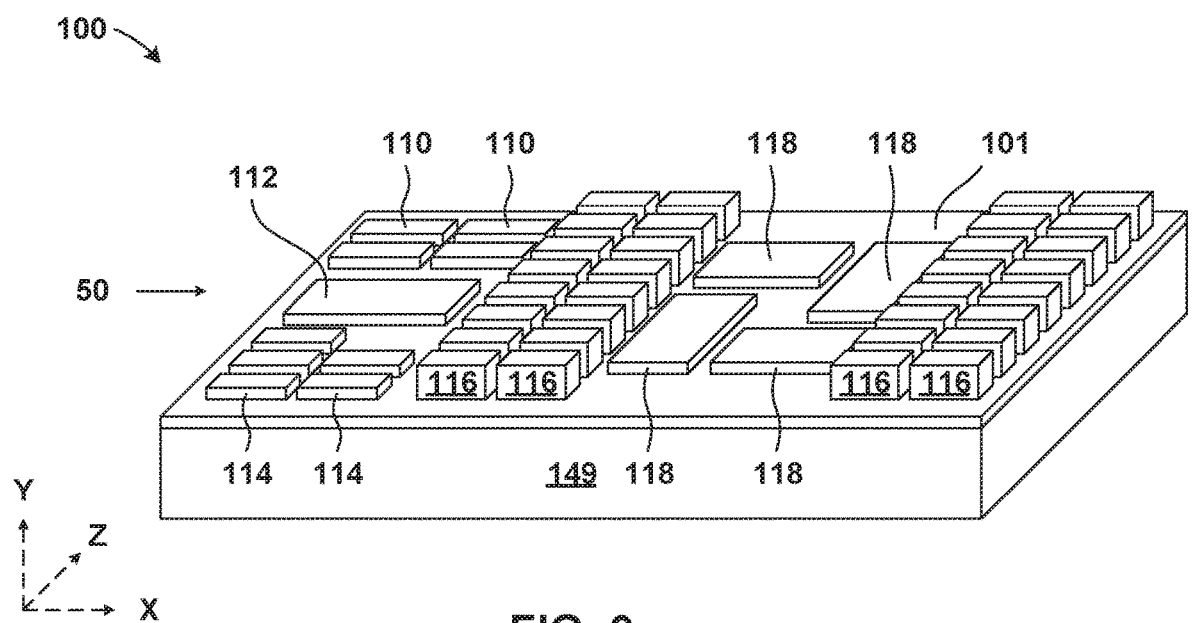
FIG. 9 is an isometric view of the first thermal interface material set between the multichip module and the module base, according to an exemplary embodiment.
Figure 10:
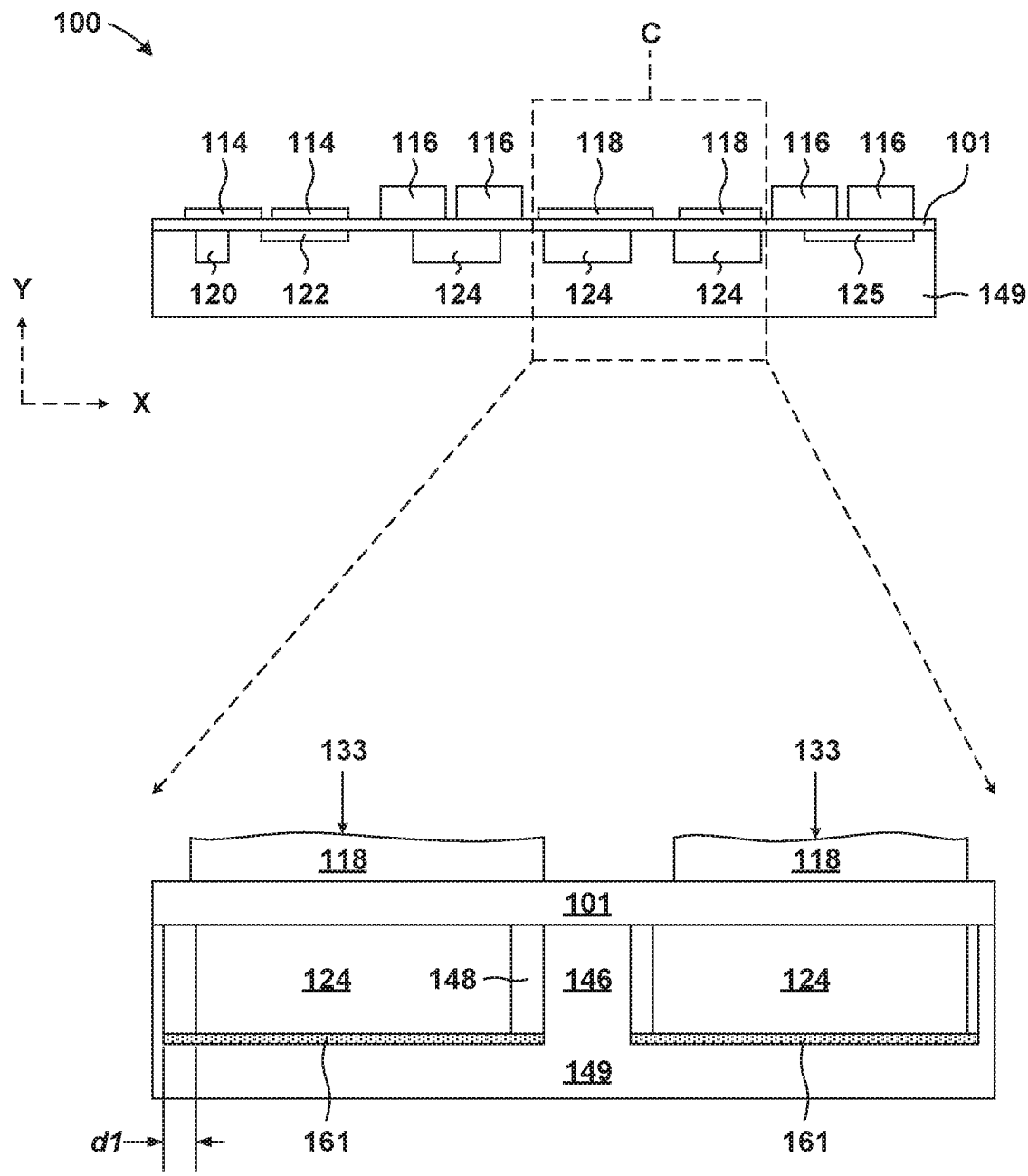
FIG. 10 is a cross section view of the module base, the first thermal interface material and the multichip module, according to an exemplary embodiment.
Figure 11:
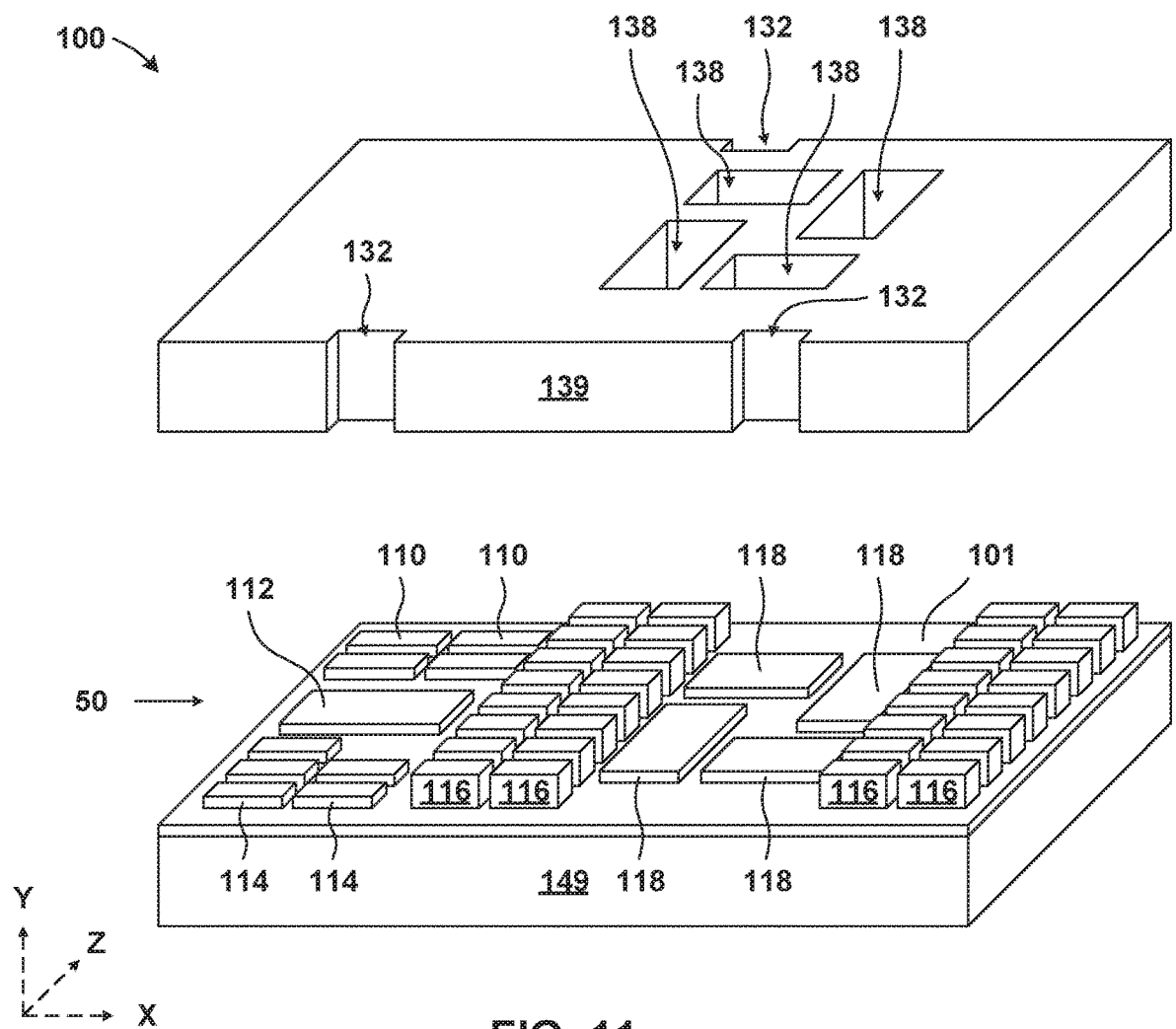
FIG. 11 is an exploded view of the module base, the multichip module and a temporary lid, according to an exemplary embodiment.
Figure 12:
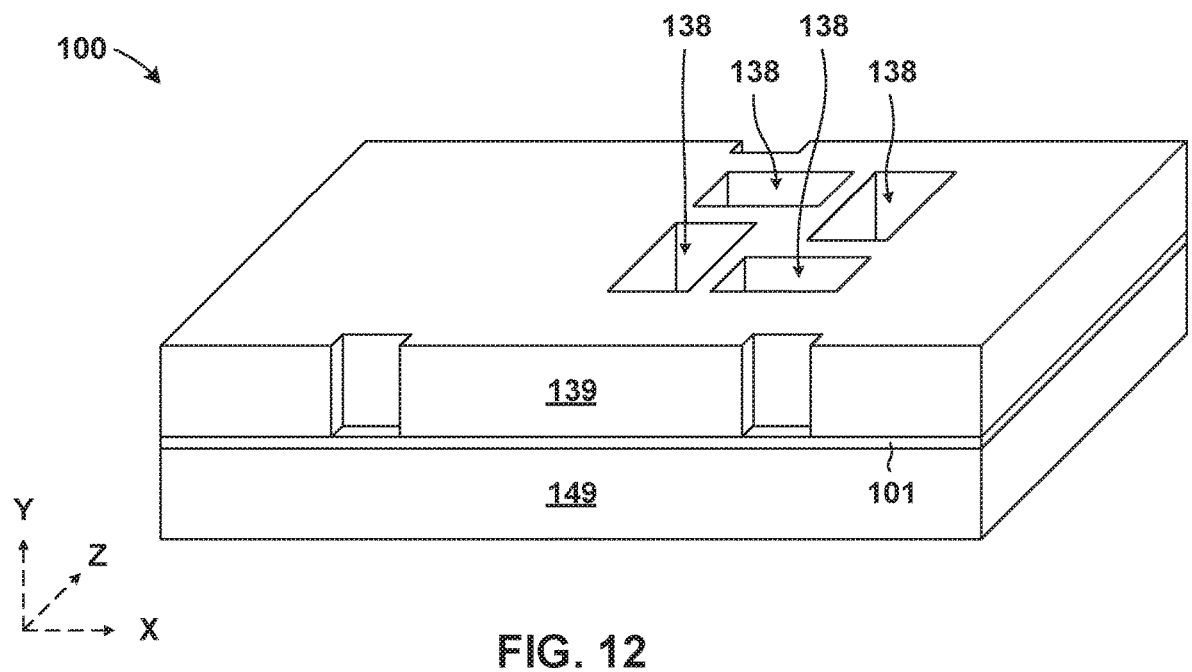
FIG. 12 is an isometric view of the module base, the multichip module and the temporary lid, according to an exemplary embodiment.
Figure 13:
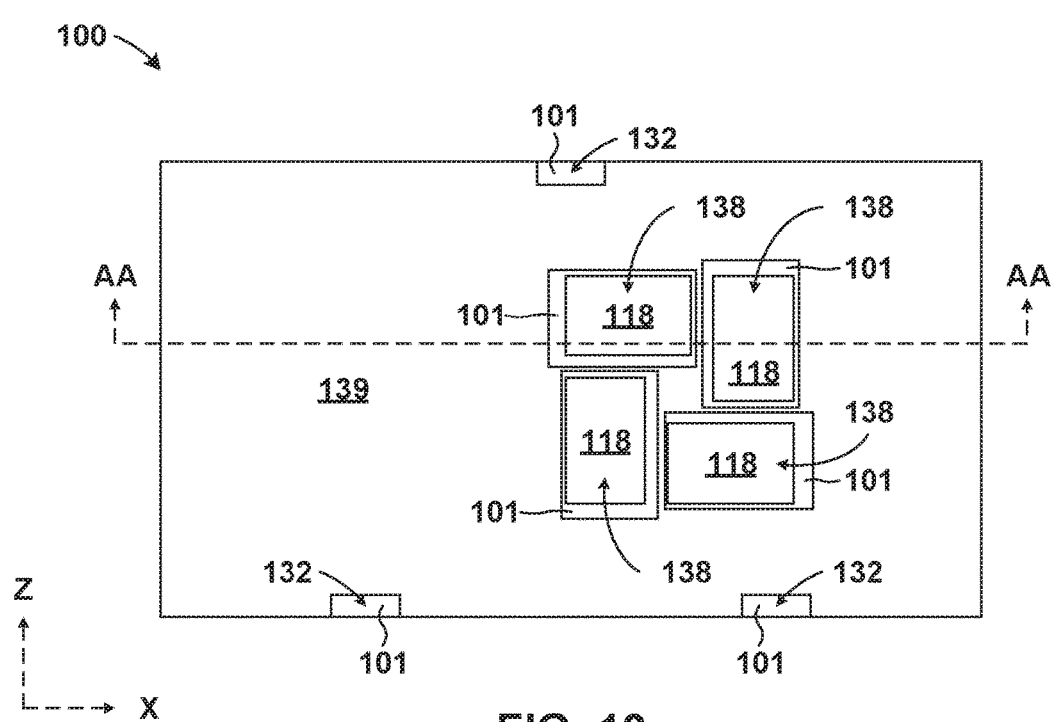
FIG. 13 is a top view of the multichip module and the temporary lid, according to an exemplary embodiment.

Now referring to FIGS. 8-10, an apparatus 100 during an intermediate step of a method of fabricating a custom module lid is illustrated, according to an embodiment. More specifically, the method may include placing the MCM 50 on the module base 149. FIG. 10 may include a cross section view of the MCM 50 and the module base 149. Additionally, FIG. 10 includes a section view taken along section C.

A first thermal interface material (TIM) 161 may be inserted in the base pocket 148. The first TIM 161 may include any thermal interface material known in the art, such as, for example, an elastomeric thermal interface material. However, it may be advantageous to use a more efficient thermal material over components having high power densities (e.g., the target components), such as, for example, a curable thermal gel. The first TIM 161 may have a thickness from about 0.5 mm to about 0.75 mm, but other thicknesses may be used.

The MCM 50 may be placed on the module base 149. The first component may fit into a corresponding base pocket 148. The first TIM 161 may be between the first component and a bottom surface of the base pocket 148. There may be a clearance gap (d1) between the first component and a sidewall of the base pocket 148 ranging from about 1 mm to about 2 mm. A top portion of the module base 149 that is in-between the base pockets 148 and/or within a perimeter of the module base 149 may be referred to as a base support rib 146. The bottom surface of the substrate 101 may be directly on the base support rib 146 (i.e., the bottom surface of the substrate 101 is coplanar with a top surface of the base support rib 146).

Figure 14:
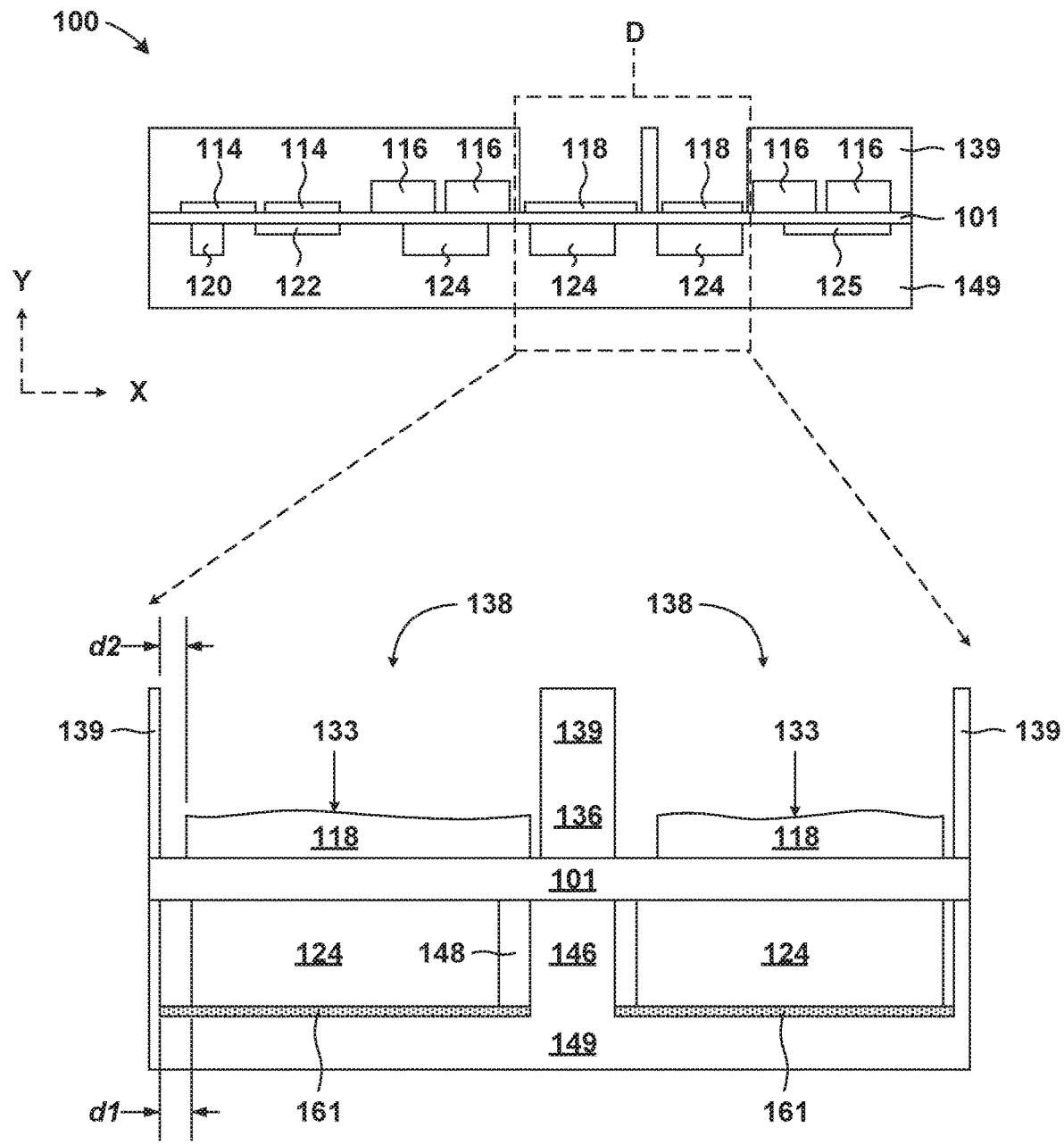
FIG. 14 is a cross section view of the module base, the temporary lid and the multichip module, according to an exemplary embodiment.

Now referring to FIGS. 11-14, the apparatus 100 during an intermediate step of a method of fabricating a custom module lid is illustrated, according to an embodiment. More specifically, the method may include placing a temporary lid 139 on the module base 149 to measure target component topography. FIG. 14 may include a cross section view of the temporary lid 139, the MCM 50 and the module base 149, taken along section line AA. Additionally, FIG. 14 includes a section view taken along section D.

The temporary lid 139 may include a viewing window 138, a datum window 132 and a temporary pocket. The viewing window 138 and the datum window 132 may be openings in the temporary lid 139 and extend through the temporary lid 139 (i.e., extending from a top surface of the temporary lid 139 to a bottom surface of the temporary lid 139). The viewing window 138 may have similar, but slightly larger, dimensions as the target component (e.g., the ASIC 118) in the x-z plane. The temporary pocket may be an opening on the bottom surface of the temporary lid 139 that extends a distance into the temporary lid 139 equal to a distance less than the thickness of the temporary lid 139. The temporary pocket may have similar, but slightly larger, dimensions as the second component in the x-z plane (e.g., the HMC 116). A bottom portion of the temporary lid 139 that is in-between the viewing window 138, the datum window 132, the temporary pocket and/or within a perimeter of the temporary lid 139 may be referred to as a temporary support rib 136.

The temporary lid 139 may be placed on the MCM 50. The second component may fit inside of the temporary pocket and the target component may fit inside of the viewing window 138 (e.g., the second component may be covered by the temporary lid 139 and the target component may be exposed through the viewing window 138). A bottom surface of the temporary support rib 136 may be directly on the top surface of the substrate 101 (i.e., the bottom surface of the temporary support rib 136 is coplanar with the top surface of the substrate 101). The viewing window 138 may be larger than the target components by a clearance gap (d2). The clearance gap (d2) may range from about 1 mm to about 2 mm, but other distances may be present.

In an embodiment, there may be four target components (four ASIC's 118) and four corresponding viewing windows 138 where the four target components are inside of the four viewing windows 138. There may be multiple second components that are inside of the temporary pockets. There may be three datum points that expose three different portions of the substrate 101. Also, the temporary lid 139 may be fastened to the module base 149 using screws, brackets, slots, fins or any other means. The temporary lid 139 and the module base 149 may apply pressure to the MCM 50 through the base support rib 146 and the temporary support rib 136. A temporary fin around the perimeter of the temporary lid 139 may fit inside the slot of the module base 149 (not illustrated).

Once the temporary lid 139 is placed on the MCM 50, a reference plane may be measured through the datum window 132. The reference plane may be the top surface of the substrate 101. Next, a top surface of the target component may be measured through the viewing window 138 for surface flatness, imperfections, altered dimensions, or other variations. The top surface of the target component may be measured in reference to the reference plane. The top surface of the target component and the top surface of the substrate 101 may be measured using any measurement technique known in the art, such as an optical or mechanical process and may be applied to a computer added drawing program for mapping (i.e., create a target surface profile 133). After the target surface profile 133 is measured and/or mapped, the temporary lid 139 may be removed. In an alternative embodiment, the temporary lid 139 may remain on the apparatus 100 and inserts (described with reference to FIGS. 17 and 18) may be placed in the viewing windows 138 and/or in the datum window 132. The target surface profile 133 may be subsequently used to form a custom pocket in a custom lid.

In an embodiment, the target component may include four ASIC's 118 having high power densities compared to other heat dissipating components on the MCM 50. The four ASIC's 118 may have four corresponding viewing windows 138. A top surface of the ASIC's 118 may be measured using an optical process and an ASIC profile may be created on a computer aided program for subsequent ASIC pocket formation in a custom module lid.

Figure 15:
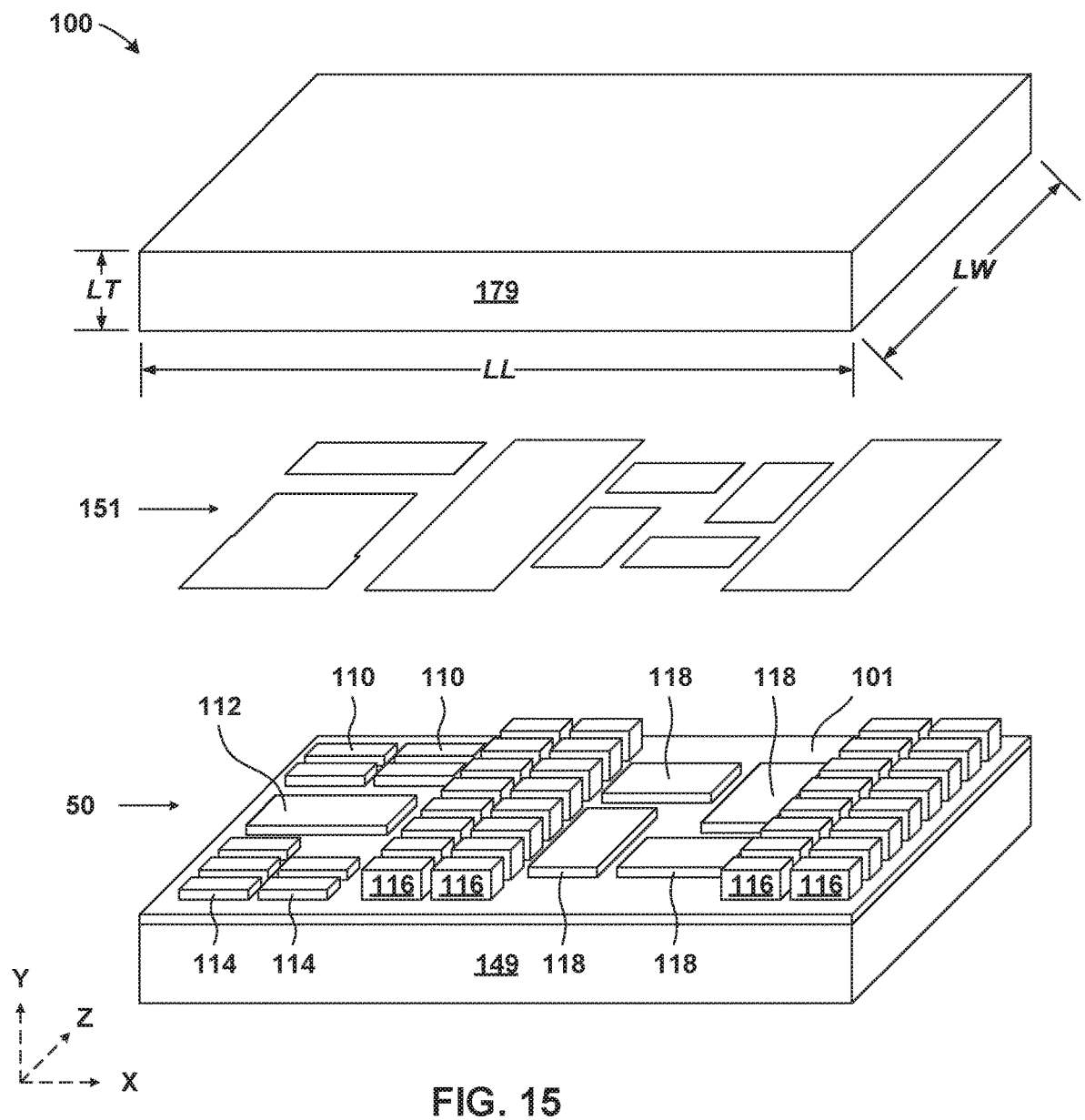
FIG. 15 is an exploded view of a second thermal interface material set between the multichip module and a custom module lid, according to an exemplary embodiment.
Figure 16:
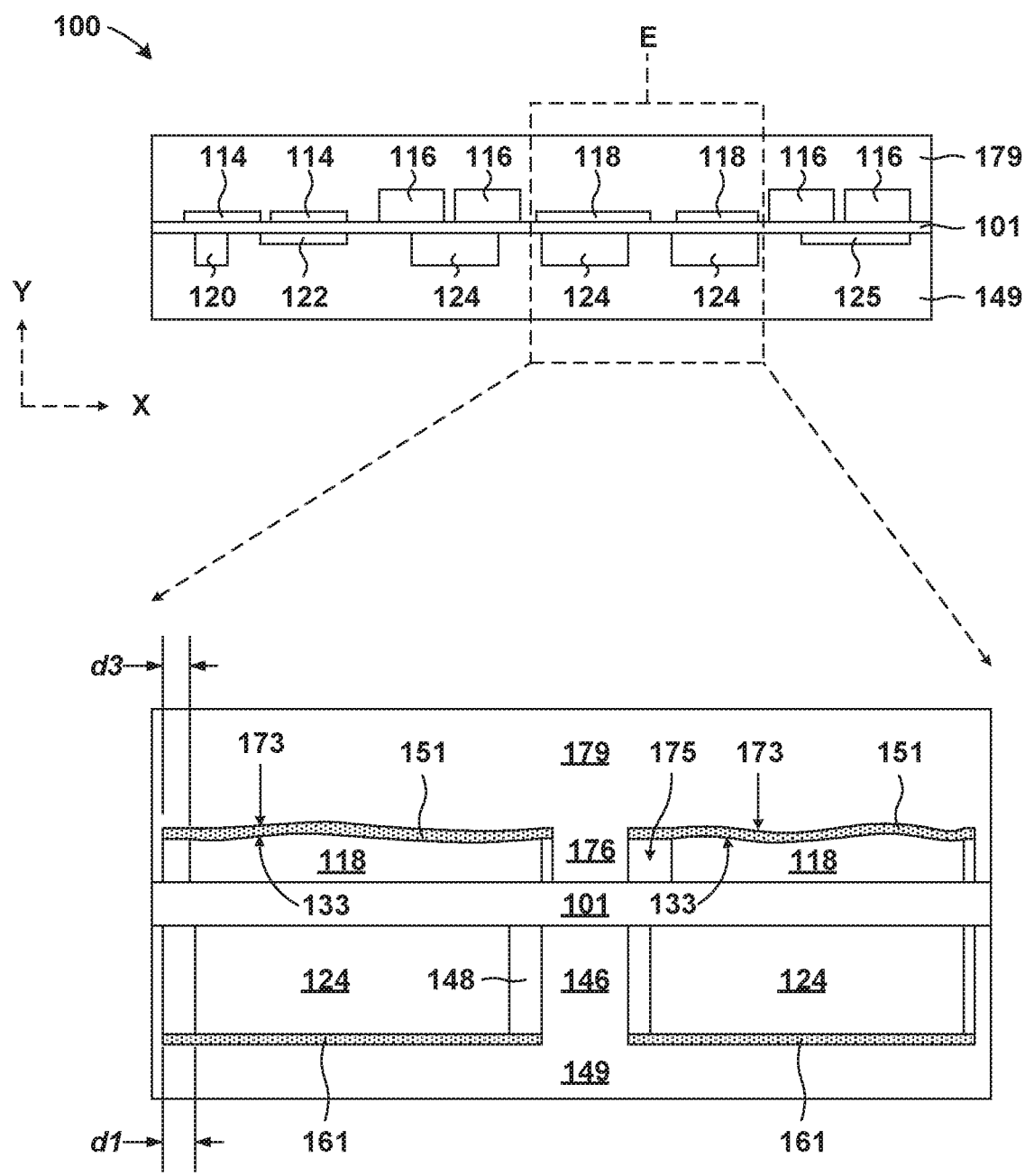
FIG. 16 is a cross section view of the module base, the first thermal interface material, the second thermal interface material, the multichip module and the custom module lid, according to an exemplary embodiment.

Now referring to FIGS. 15 and 16, the apparatus 100 during an intermediate step of a method of fabricating a custom module lid is illustrated, according to an embodiment. More specifically, the method may include forming a custom lid 179 and placing the custom lid 179 on the module base 149. FIG. 16 may include a cross section view of the custom lid 179, the MCM 50 and the module base 149. Additionally, FIG. 16 includes a section view taken along section E.

The custom lid 179 may be formed using any known formation techniques known in the art, such as, for example, a machining process. The custom lid 179 may include any durable material having a high thermal conductivity, such as, for example, a metal or metallic alloy including aluminum. The custom lid 179 may have similar dimensions as the module base 149, for example, having a lid thickness (LT) of about 14.5 mm, a lid width (LW) of about 102 mm, and a lid length (LL) of about 182 mm, but other dimensions may be used. The dimensions of the custom lid 179 may vary depending up the size of the MCM 50. In an alternative embodiment, the custom lid 179 may have a nominal thickness of about 10 mm. Additionally, the custom lid 179 may include a lid fin around the perimeter of the custom lid 179 and may fit inside the slot of the module base 149 (not illustrated).

It should be noted, the custom lid 179 and the module base 149 may each be fabricated from a single piece of material but, alternatively, the custom lid 179 and the module base 149 may be constructed from multiple blocks of different or similar materials and attached using conventional means. In an embodiment, the custom lid 179 may be a cold plate or heat sink to create additional thermal support for the process or packaging.

A custom pocket 175 and a standard pocket may be formed in the custom lid 179. The custom pocket 175 and the standard pocket may be formed using any method known in the art, such as, for example, a machine processing technique. The custom pocket 175 may have similar, but slightly larger, dimensions as the target component (in the x-z plane). A custom surface 173 may be formed in the custom pocket 175 and may be a top surface of the custom pocket 175. The custom surface 173 may be formed from the dimensions and layout of the target surface profile 133. The standard pocket may have similar, but slightly larger, dimensions as the second component (in the x-z plane). The standard pocket may have a flat inside surface, as is typically used during packaging.

A second TIM 151 may be inserted in the custom pocket 175 and in the standard pockets. The second TIM 151 may improve the thermal interface between the components and the custom surface 173 or the flat surface. The second TIM 151 may be any thermal interface material known in the art, such as, for example, a curable thermal gel. The second TIM 151 may have a thickness from about 0.025 mm to about 0.05 mm, but other thicknesses may be used.

The custom lid 179 may be placed on the MCM 50. The second component may fit inside of the standard pocket and the target component may fit inside of the custom pocket 175. A bottom portion of the custom lid 179 that is in-between the standard pocket, the custom pocket 175 and/or within the perimeter of the custom lid 179 may be referred to as a lid support rib 176. A bottom surface of the lid support rib 176 may be directly on the top surface of the substrate 101 (i.e., the bottom surface of the lid support rib 176 is coplanar with the top surface of the substrate 101). There may be a clearance gap (d3) between the target component and the custom pocket 175. The clearance gap (d3) may range from about 1 mm to about 2 mm, but other distances may be present.

In an embodiment, the target component may include four ASIC's 118. The four ASIC's 118 may have four corresponding custom pockets 175. There may be four custom surfaces 173 that match the target surface profile 133 of the corresponding ASIC 118.

Figure 17:
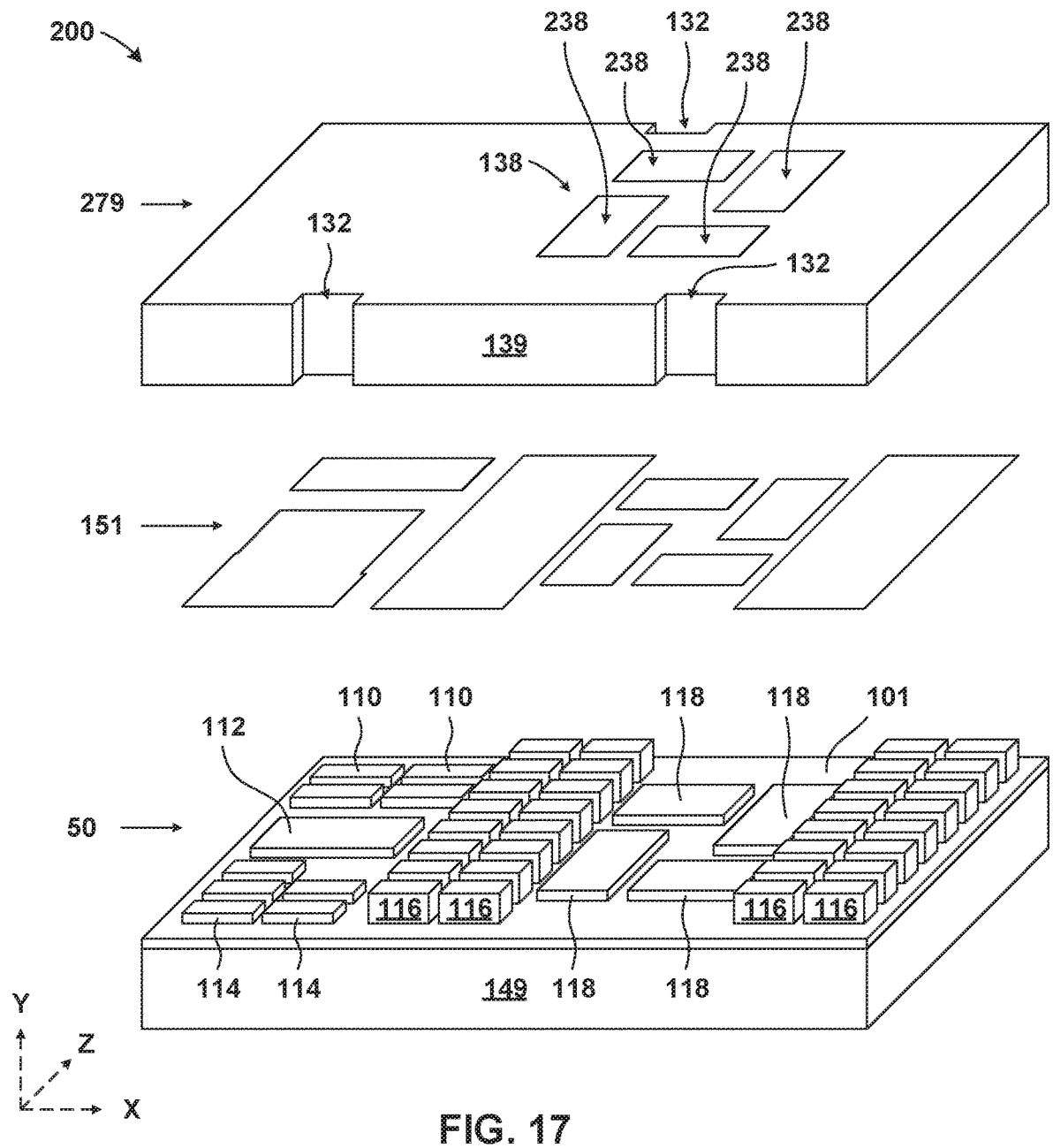
FIG. 17 is an alternative exploded view of the second thermal interface material set between the multichip module and a custom insert lid, according to an alternative embodiment.
Figure 18:
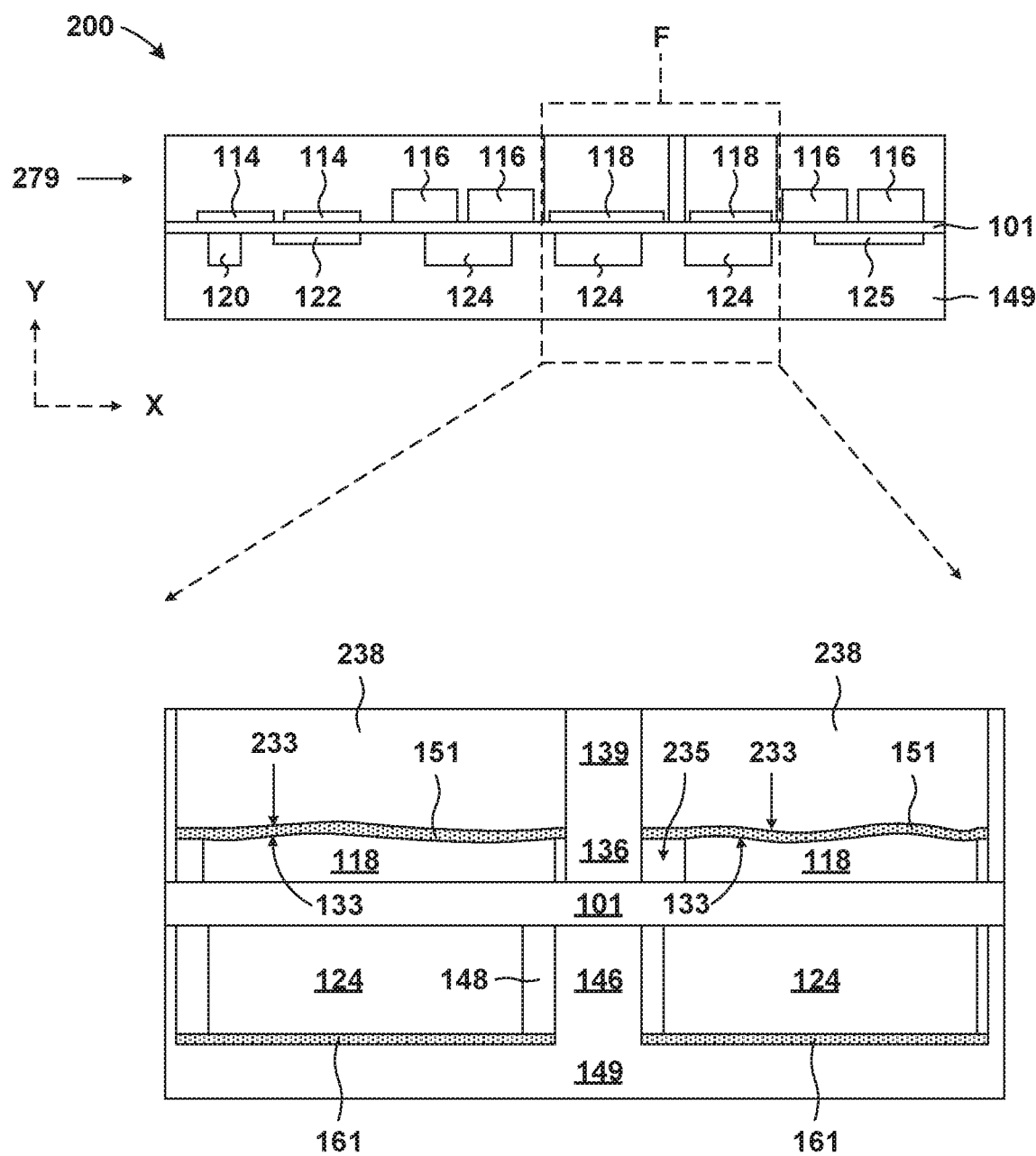
FIG. 18 is an alternative cross section view of the module base, the first thermal interface material, the second thermal interface material, the multichip module and the custom insert lid, according to an alternative embodiment.

Now referring to FIGS. 17 and 18, an alternative apparatus 200 during an intermediate step of a method of fabricating a custom module lid is illustrated, according to an alternative embodiment. More specifically, the method may include placing inserts 238 in the viewing window 138. FIG. 18 may include a cross section view of the temporary lid 139, the MCM 50 and the module base 149. Additionally, FIG. 18 includes a section view taken along section F. It should be noted, FIG. 17 is an alternative embodiment of the apparatus 100 illustrated in FIG. 15 and FIG. 18 is an alternative embodiment of the apparatus 100 illustrated in FIG. 16.

A custom lid 279 may include the temporary lid 139 and inserts 238 placed in the viewing window 138 and/or in the datum window 132 after the target surface profile 133 is measured. It should be noted, the custom insert lid 279 may be similar (e.g., similar dimensions) to the custom lid 179 described with reference to FIGS. 15 and 16. The inserts may have a custom insert surface 233 as a bottom surface. The inserts 238 may be formed using any known formation techniques known in the art, such as, for example, a machining process. The custom insert surface 233 may be similar to the target surface profile 133. The inserts 238 may include any durable material having a high thermal conductivity, such as, for example, a metal or metallic alloy including aluminum. The inserts 238 may have similar, but slightly smaller, dimensions as the viewing window 138 and/or the datum windows 132. In the illustrated embodiment, four inserts 238 are inserted into four viewing windows 138. Once the inserts 238 are placed in the viewing window 138, a top surface of the inserts 238 may be coplanar with the top surface of the temporary lid 139 and the custom insert surface 233 may be a distance above the bottom surface of the temporary lid 139, such that a custom insert pocket 235 remains below the inserts 238. The custom insert pocket 235 may have similar, but slightly larger, dimensions as the target component (in the x-z plane).

In an embodiment, the inserts 238 may be placed in the viewing windows 138 after the target surface profile 133 is measured and while the temporary lid 139 is on the MCM 50. In such an embodiment, the second TIM 151 may be inserted before the inserts 238 are placed in the viewing window 138. In an alternative embodiment, the temporary lid 139 may be removed, followed by placing the inserts 238 into the viewing window 138, placing the second TIM 151 in the custom insert pockets 235, then placing the custom insert lid 279 on the MCM 50.

One of the benefits of this invention may include a solution to a problem of creating a uniform gap between a package and module components. One of the exemplary embodiments of this invention includes mapping of a top surface of a multichip module (MCM) using either optical or mechanical measurement techniques and then to custom machine a bottom surface of a lid to match the MCM profile. This may allow a uniform gap between the chip surface and the MCM regardless of the curvature of the chip. This invention may allow for more uniform TIM thickness on the top surface of the chip and the module lid. It should be noted, a module package may have a different physical orientation (e.g., a vertically-disposed module substrate) but the invention may still be applied to such arrangements.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
    placing a multichip module (MCM) on a module base, wherein the MCM includes a substrate and a target component, the target component is on a top surface of the substrate, and a bottom surface of the substrate is in direct contact with a top surface of the module base;
    providing a temporary lid including a viewing window, wherein the viewing window is an opening extending from a top surface of the temporary lid to a bottom surface of the temporary lid;
    placing the temporary lid on the MCM, wherein the target component fits inside of the viewing window, and the bottom surface of the temporary lid is on the top surface of the substrate;
    mapping a surface profile of the target component through the viewing window; and
    providing a custom lid having a custom pocket, wherein the custom pocket is an opening in the custom lid on a bottom surface of the custom lid, the custom pocket has a depth extending into the custom lid that is less than a thickness of the custom lid, and the custom pocket has an inside surface with a same profile as the target component surface profile.

2. The method of claim 1, wherein the target component includes an application-specific integrated circuits.

3. The method of claim 1, wherein the target component is measured using an optical process.

4. The method of claim 1, wherein the custom lid is a cold plate.

5. The method of claim 1, wherein the module base includes a slot and the custom lid includes a corresponding fin, and the corresponding fin fits inside of the slot.

6. The method of claim 1, wherein the substrate is an organic laminate.

7. The method of claim 1, wherein the module base and the custom lid are aluminum.

8. A method comprising:
    placing a multichip module (MCM) on a module base, wherein the MCM includes a substrate and a target component, the target component is on a top surface of the substrate, and a bottom surface of the substrate is in direct contact with a top surface of the module base;

providing a temporary lid including a viewing window, wherein the viewing window is an opening extending from a top surface of the temporary lid to a bottom surface of the temporary lid;

placing the temporary lid on the MCM, wherein the target component fits inside of the viewing window, and the bottom surface of the temporary lid is on the top surface of the substrate;

mapping a surface profile of the target component through the viewing window; and providing a custom lid having a custom pocket, wherein the custom pocket is an opening on a bottom surface of the custom lid, and the custom pocket has an inside surface with a same profile as the target component surface profile.

9. The method of claim 8, wherein the target component includes an application-specific integrated circuits.

10. The method of claim 8, wherein the target component is measured using an optical process.

11. The method of claim 8, wherein the custom lid is a cold plate.

12. The method of claim 8, wherein the module base includes a slot and the custom lid includes a corresponding fin, and the corresponding fin fits inside of the slot.

13. The method of claim 8, wherein the substrate is an organic laminate.

14. The method of claim 8, wherein the module base and the custom lid are aluminum.

15. A method comprising:

placing a multichip module (MCM) on a module base, wherein the MCM includes an organic substrate and a target component, the target component is on a top surface of the organic substrate, and a bottom surface of the organic substrate is in direct contact with a top surface of the module base;

placing a temporary lid on the MCM, wherein the temporary lid includes an opening extending through an entire thickness of the temporary lid, wherein the target component fits inside of the opening, and a bottom surface of the temporary lid directly contacts the top surface of the organic substrate;

mapping a surface profile of the target component through the opening; and providing a custom lid having a custom pocket, wherein the custom pocket in a bottom surface of the custom lid, and the custom pocket has an inside surface with a same profile as the target component surface profile.

16. The method of claim 15, wherein the target component includes an application-specific integrated circuits.

17. The method of claim 15, wherein the target component is measured using an optical process.

18. The method of claim 15, wherein the custom lid is a cold plate.

19. The method of claim 15, wherein the module base includes a slot and the custom lid includes a corresponding fin, and the corresponding fin fits inside of the slot.

20. The method of claim 15, wherein the module base and the custom lid are aluminum.

* * * * *